(12) United States Patent
Sung

(10) Patent No.: US 12,550,706 B2
(45) Date of Patent: *Feb. 10, 2026

(54) INTERCONNECT STRUCTURE AND METHOD OF FORMING SAME

(71) Applicant: Taiwan Semiconductor Manufacturing Co., Ltd., Hsinchu (TW)

(72) Inventor: Su-Jen Sung, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/742,056

(22) Filed: Jun. 13, 2024

(65) Prior Publication Data

US 2024/0332191 A1 Oct. 3, 2024

Related U.S. Application Data

(60) Continuation of application No. 17/818,414, filed on Aug. 9, 2022, now Pat. No. 12,046,557, which is a (Continued)

(51) Int. Cl.
| | |
|---|---|
| *H01L 23/535* | (2006.01) |
| *H01L 21/768* | (2006.01) |
| *H01L 23/522* | (2006.01) |
| *H01L 23/528* | (2006.01) |
| *H01L 23/532* | (2006.01) |

(Continued)

(52) U.S. Cl.
CPC ...... *H01L 23/535* (2013.01); *H01L 21/76804* (2013.01); *H01L 21/76807* (2013.01); *H01L 21/76877* (2013.01); *H01L 21/76883* (2013.01); *H01L 21/76895* (2013.01); *H01L 23/5226* (2013.01); *H01L 23/5283* (2013.01); *H01L 23/53238* (2013.01); *H01L 23/53295* (2013.01); *H10D 64/251* (2025.01); *H10D 64/258* (2025.01); *H10D 64/518* (2025.01); *H01L 21/76834* (2013.01); *H01L 21/76897* (2013.01); *H01L 2924/0002* (2013.01)

(58) Field of Classification Search
CPC ............. H01L 23/535; H01L 21/76804; H01L 21/76807; H01L 21/76877; H01L 23/5226; H01L 23/5283; H01L 23/53238; H01L 23/53295; H01L 21/76897
See application file for complete search history.

(56) References Cited

U.S. PATENT DOCUMENTS

| | | |
|---|---|---|
| 5,567,650 A | 10/1996 | Straight et al. |
| 5,933,756 A | 8/1999 | Fuse |

(Continued)

*Primary Examiner* — Phat X Cao
(74) *Attorney, Agent, or Firm* — Slater Matsil, LLP

(57) ABSTRACT

An apparatus comprises a first metal feature in a first dielectric layer over a substrate, wherein a sidewall portion of the first dielectric layer is over a top surface of the first metal feature, a second dielectric layer over the first dielectric layer and a second metal feature extending through the second dielectric layer, wherein a bottom of a first portion of the second metal feature is in contact with the top surface of the first metal feature and a bottom of a second portion of the second metal feature is in contact with the sidewall portion of the first dielectric layer.

20 Claims, 8 Drawing Sheets

Related U.S. Application Data division of application No. 16/707,450, filed on Dec. 9, 2019, now Pat. No. 11,502,035, which is a continuation of application No. 15/439,234, filed on Feb. 22, 2017, now Pat. No. 10,510,666, which is a division of application No. 14/080,030, filed on Nov. 14, 2013, now Pat. No. 9,583,429.

(51) Int. Cl.
*H10D 64/23* (2025.01)
*H10D 64/27* (2025.01)

(56) References Cited

U.S. PATENT DOCUMENTS

| | | | |
|---|---|---|---|
| 5,935,868 A | 8/1999 | Fang et al. | |
| 6,303,488 B1 | 10/2001 | Sandhu et al. | |
| 8,102,054 B2 | 1/2012 | Zhang et al. | |
| 8,765,604 B2 * | 7/2014 | Vannier | H01L 21/76849 |
| | | | 438/666 |
| 9,006,078 B2 | 4/2015 | Kim | |
| 9,583,429 B2 | 2/2017 | Sung | |
| 10,510,666 B2 | 12/2019 | Sung | |
| 11,502,035 B2 * | 11/2022 | Sung | H01L 23/53295 |
| 2001/0055842 A1 | 12/2001 | Uh et al. | |
| 2005/0082089 A1 * | 4/2005 | Grunow | H01L 21/76856 |
| | | | 174/257 |
| 2006/0081987 A1 | 4/2006 | Kobayashi | |
| 2009/0206491 A1 | 8/2009 | Wada et al. | |
| 2014/0061929 A1 | 3/2014 | Inaba et al. | |
| 2014/0117558 A1 * | 5/2014 | Boyanov | H01L 23/5226 |
| | | | 438/618 |

* cited by examiner

INTERCONNECT STRUCTURE AND METHOD OF FORMING SAME

PRIORITY CLAIM AND CROSS-REFERENCE

This application is a continuation of U.S. patent application Ser. No. 17/818,414, filed on Aug. 9, 2022, now U.S. Pat. No. 12,046,557, issued Jul. 23, 2024, entitled "Interconnect Structure and Method of Forming Same," which is a divisional of U.S. patent application Ser. No. 16/707,450, filed on Dec. 9, 2019, now U.S. Pat. No. 11,502,035 issued Nov. 15, 2022, entitled "Interconnect Structure and Method of Forming Same," which is a continuation of U.S. patent application Ser. No. 15/439,234, filed on Feb. 22, 2017, now U.S. Pat. No. 10,510,666 issued Dec. 17, 2019, entitled "Interconnect Structure and Method of Forming Same," which is a divisional of U.S. patent application Ser. No. 14/080,030, filed on Nov. 14, 2013, now U.S. Pat. No. 9,583,429 issued Feb. 28, 2017, entitled "Interconnect Structure and Method of Forming Same," each application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for low resistance structures such as interconnects to further improve the thermal performance of electronic devices.

A semiconductor device may include a variety of semiconductor structures such as transistors, capacitors, resistors and the like formed in a substrate. One or more conductive layers formed of a metal, metal alloy and the like are separated by dielectric layers. There may be a variety of interconnect structures formed between the conductive layers to interconnect the semiconductor structures, provide an electrical connection between a metal layer and its adjacent metal layer. Vias are formed in the dielectric layers to provide an electrical connection between adjacent metal lines. In sum, metal lines and vias interconnect the semiconductor structures and provide a conductive channel between the semiconductor structures and the external contacts of the semiconductor device.

A metal line and its adjacent via may be formed by using a dual damascene process. According to the fabrication process of a dual damascene structure, a dual damascene opening comprising a via portion and a trench portion is formed within a dielectric layer. The dual damascene opening may be formed by photolithography techniques known in the art. Generally, photolithography involves depositing a photoresist material and then irradiating (exposing) and developing in accordance with a specified pattern to remove a portion of the photoresist material. The remaining photoresist material protects the underlying material from subsequent processing steps, such as etching. The etching process may be a wet or dry, anisotropic or isotropic, etch process. After the etching process, the remaining photoresist material may be removed. It should also be noted that the damascene interconnect opening may be formed by one or more alternative process steps (e.g., a via first or a trench first damascene process).

After the dual damascene opening is formed, a barrier layer and a seed layer may be formed along the sidewalls and the bottom of the dual damascene opening. The barrier layer may be formed by suitable fabrication techniques such as various physical vapor deposition (PVD) techniques and the like. The seed layer may be formed by using suitable fabrication techniques such as PVD, electroless plating and the like.

Furthermore, an electroplating process may be applied to the dual damascene opening. As a result, the dual damascene opening is filled with a conductive material. The conductive material may comprise copper, although other suitable materials such as aluminum, alloys, tungsten, silver, doped polysilicon, combinations thereof, and/or the like, may alternatively be utilized.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely an interconnect structure including a plurality of metal lines and vias. The embodiments of the disclosure may also be applied, however, to a variety of semiconductor devices. Hereinafter, various embodiments will be explained in detail with reference to the accompanying drawings.

Figure 1:
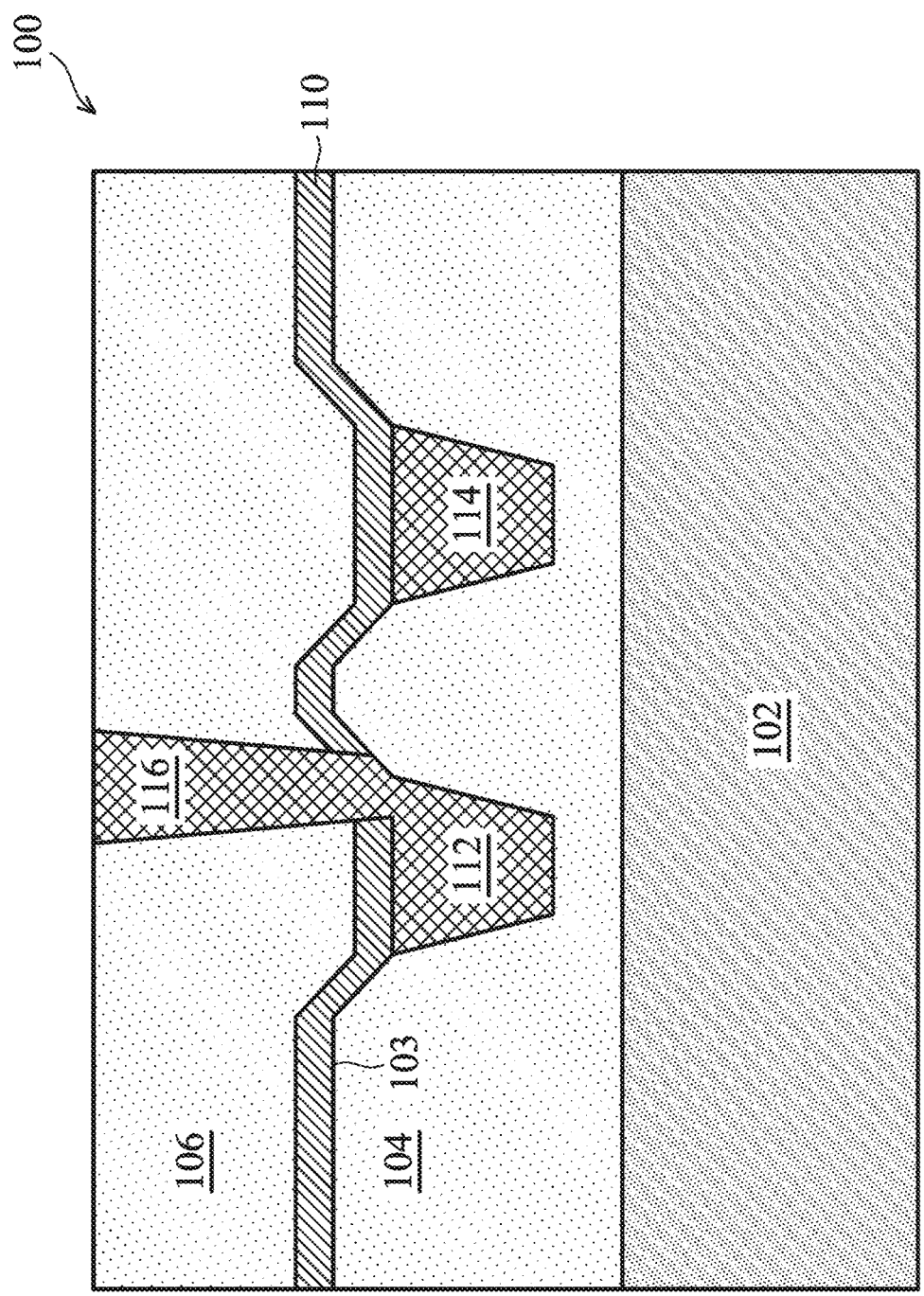
FIG. 1 illustrates a cross sectional view of an interconnect structure of a semiconductor device in accordance with various embodiments of the present disclosure.

FIG. 1 illustrates a cross sectional view of an interconnect structure of a semiconductor device in accordance with various embodiments of the present disclosure. The semiconductor device 100 includes a substrate 102. A first dielectric layer 104 is formed over the substrate 102. A first conductive structure 112 and a second conductive structure 114 are embedded in the first dielectric layer 104. In some embodiments, the first conductive structure 112 is a first metal line. The second conductive structure 114 is a second metal line. Throughout the description, the first conductive structure 112 is alternatively referred to as the first metal line 112. The second conductive structure 114 is alternatively referred to as the second metal line 114.

As shown in FIG. 1, the top surfaces of the first metal line 112 and the second metal line 114 are not level with the top surface 103 of the first dielectric layer 104. Instead, there may be two inverted trapezoidal trenches formed over the top surfaces of the first metal line 112 and the second metal line 114 respectively. The detailed formation process and the advantages of these two inverted trapezoidal trenches will be described below with respect to FIGS. 3-7.

FIG. 1 further illustrates a second dielectric layer 110 formed over the first dielectric layer 104 and the top surfaces of the first metal line 112 and the second metal line 114. In some embodiments, the second dielectric layer 110 may function as a liner layer. The detailed fabrication process of the second dielectric layer 110 will be described below with respect to FIG. 6.

The semiconductor device 100 may further comprise a third dielectric layer 106 and a third conductive structure 116. As shown in FIG. 1, the third dielectric layer 106 is deposited over the second dielectric layer 110 and the third conductive structure 116 is embedded in the third dielectric layer 106. In some embodiments, the third conductive structure 116 is a via. Throughout the description, the third conductive structure 116 is alternatively referred to as the via 116.

As shown in FIG. 1, a bottom portion of the via 116 is in direct contact with a top surface of the first metal line 112. More particularly, the bottom portion of the via 116 is conformal to the sidewall of the inverted trapezoidal trench, which is formed over the first metal line 112.

One advantageous feature of having the inverted trapezoidal trenches over the metal lines (e.g., first metal line 112) is that the inverted trapezoidal trenches help to increase the spacing between two adjacent conductive structures (e.g., the via 116 and the second metal line 114).

In accordance with some embodiments, during fabrication processes of the semiconductor device 100, overlay alignment shift defects may cause a shift of the via 116 from the centerline of the first metal line 112 to the edge of the first metal line 112. Such a shift may reduce the spacing between two adjacent conductive structures (e.g., the via 116 and the second metal line 114). The reduced spacing may further affect the semiconductor device's characteristics such as a short circuit between two adjacent conductive structures, breakdown voltage degradation and/or the like. The advantages of having the inverted trapezoidal trenches will be described in detail with respect to FIG. 8.

Figure 2:
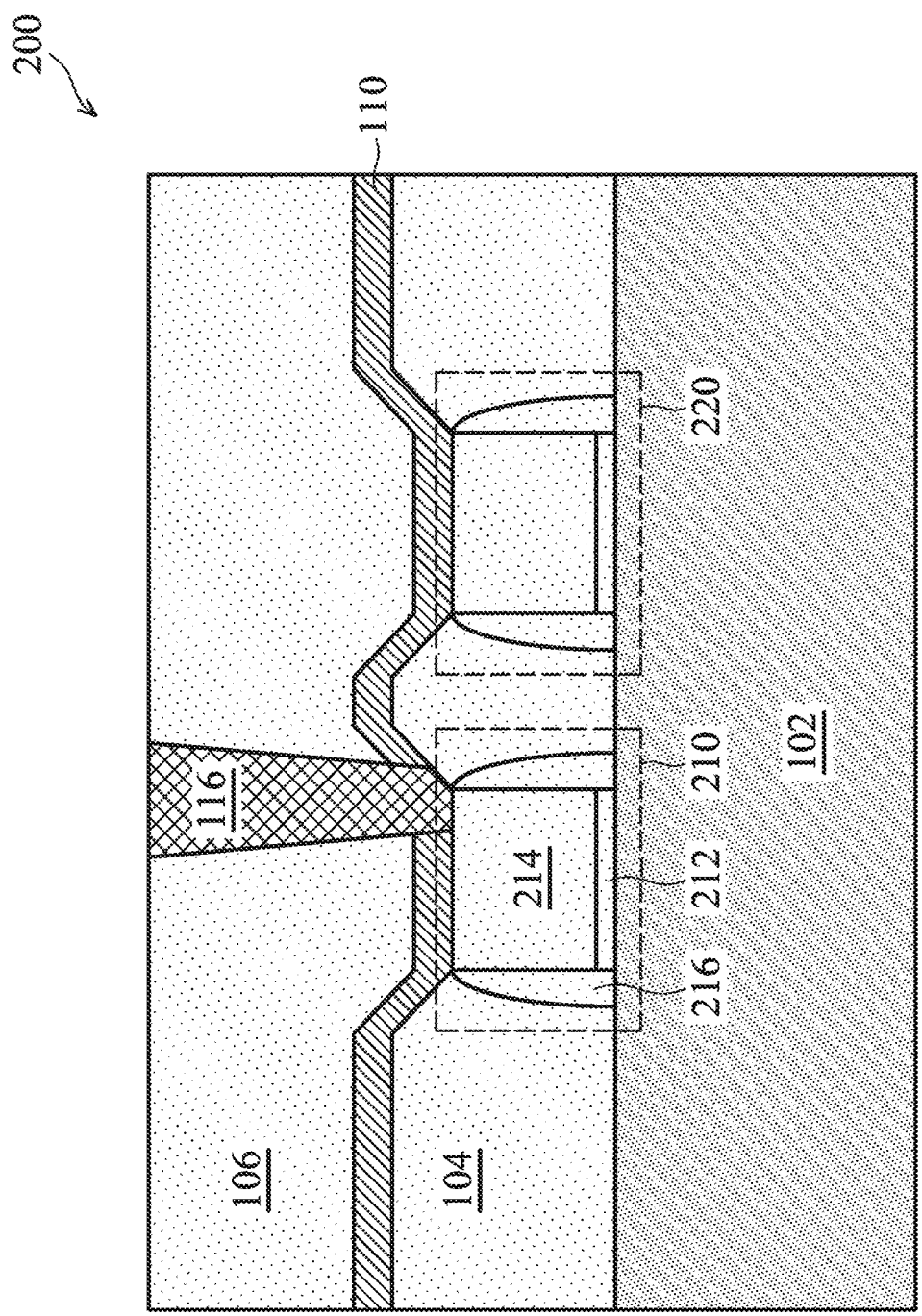
FIG. 2 illustrates a cross sectional view of another interconnect structure of a semiconductor device in accordance with various embodiments of the present disclosure.

FIG. 2 illustrates a cross sectional view of another interconnect structure of a semiconductor device in accordance with various embodiments of the present disclosure. The interconnect structure as well as the overlay alignment shift of the semiconductor device 200 is similar to that of the semiconductor device 100 shown in FIG. 1 except that the first metal line 112 and the second metal line 114 are replaced by a first gate structure 210 and a second gate structure 220 respectively.

The substrate 102 may comprise a variety of electrical circuits such as metal oxide semiconductor (MOS) transistors and the associated contact plugs (not shown respectively). For simplicity, only the first gate structure 210 and the second gate structure 220 are presented to illustrate the innovative aspects of various embodiments.

Furthermore, the first gate structure 210 and the second gate structure 220 may be the same structure. For simplicity, only the structure of the first gate structure 210 will be described in detail below.

As shown in FIG. 2, the first gate structure 210 includes a gate dielectric layer 212 formed over the substrate 102, a gate electrode 214 formed over the gate dielectric layer 212 and gate spacers 216.

The gate dielectric layer 212 may be a dielectric material such as silicon oxide, silicon oxynitride, silicon nitride, an oxide, a nitrogen-containing oxide, a combination thereof and/or the like. The gate dielectric layer 212 may have a relative permittivity value greater than about 4. Other examples of such materials include aluminum oxide, lanthanum oxide, hafnium oxide, zirconium oxide, hafnium oxynitride, combinations thereof and/or the like. In an embodiment in which the gate dielectric layer 212 comprises an oxide layer, the gate dielectric layer 212 may be formed by a plasma enhanced chemical vapor deposition (PECVD) process using tetraethoxysilane (TEOS) and oxygen as a precursor. In accordance with some embodiments, the gate dielectric layer 212 may be of a thickness in a range from about 8 Angstroms to about 200 Angstroms.

The gate electrode 214 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like.

In some embodiments in which the gate electrode 214 is poly-silicon, the gate electrode 214 may be formed by depositing doped or undoped poly-silicon by low-pressure chemical vapor deposition (LPCVD) to a thickness in the range of about 400 Angstroms to about 2,400 Angstroms.

The spacers 216 may be formed by blanket depositing one or more spacer layers (not shown) over the gate electrode 214 and the substrate 102. The spacer layers 216 may comprise suitable dielectric materials such as silicon nitride (SiN), oxynitride, silicon carbide (SiC), silicon oxynitride (SiON), oxide, any combinations thereof and/or the like. The spacer layers 216 may be formed by commonly used techniques such as chemical vapor deposition (CVD), PECVD, sputtering and/or the like.

Figure 3:
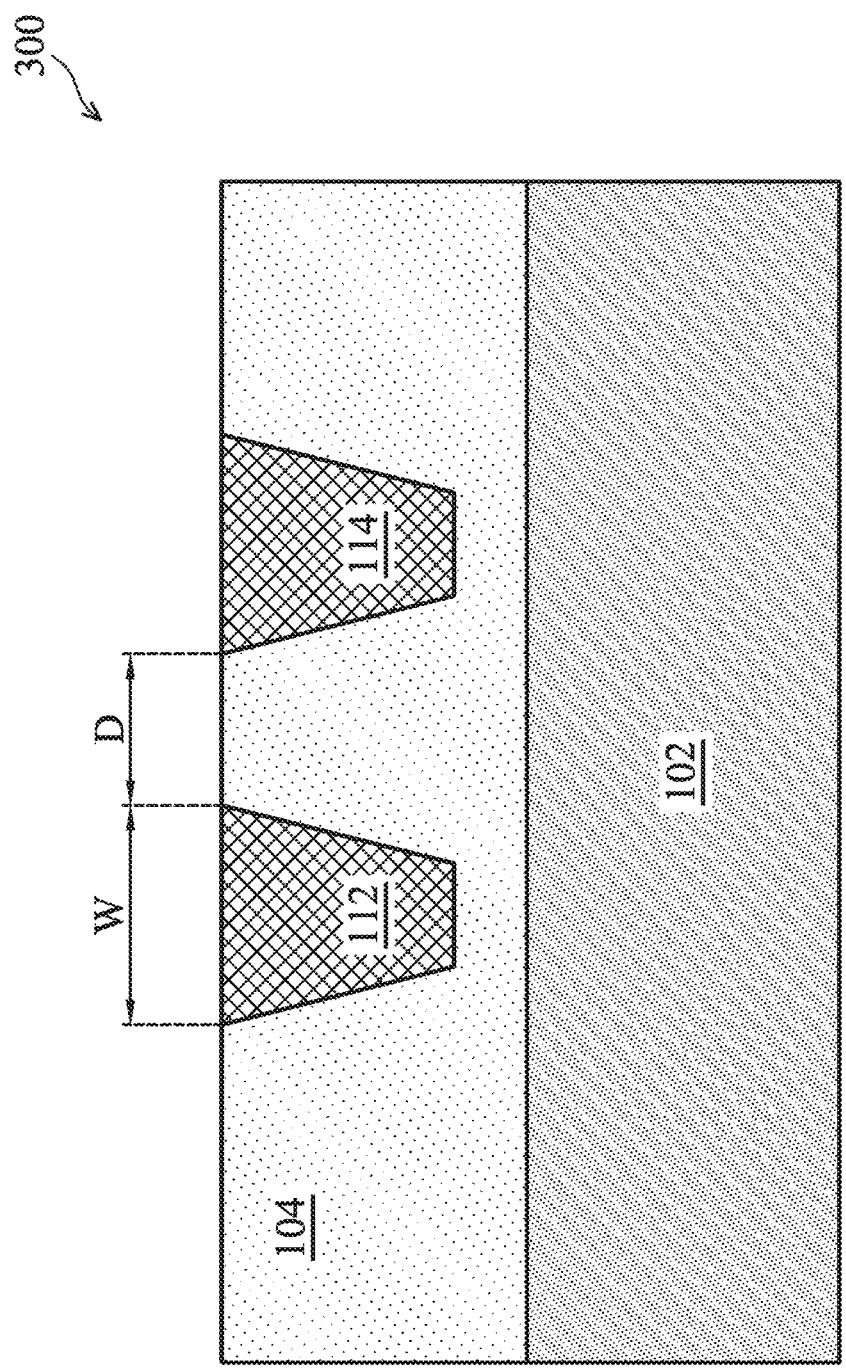
FIG. 3 illustrates a cross sectional view of a semiconductor device having a plurality of metal lines in accordance with various embodiments of the present disclosure.

FIGS. 3-8 illustrate intermediate steps of fabricating the interconnect structure shown in FIG. 1 in accordance with various embodiments of the present disclosure. FIG. 3 illustrates a cross sectional view of a semiconductor device having a plurality of metal lines in accordance with various embodiments of the present disclosure. As shown in FIG. 3, the semiconductor device 300 comprises a first dielectric layer 104 formed over the substrate 102. A first metal line 112 and a second metal line 114 are embedded in the first dielectric layer 104. In some embodiments, the top surfaces of the first metal line 112 and the second metal line 114 are exposed outside the first dielectric layer 104 as shown in FIG. 3.

In some embodiments, the width of the metal lines (e.g., first metal line 112) is defined as W. The spacing between two adjacent metal lines (e.g., first metal line 112 and second metal line 114) is defined as D. In some embodiments, W is approximately equal to 20 nm. D is approximately equal to 20 nm.

The substrate 102 may be formed of suitable semiconductor materials such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used.

Additionally, the substrate 102 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 102 may be doped with a p-type dopant, such as boron, aluminum, gallium, or the like, although the substrate may alternatively be doped with an n-type dopant, as is known in the art.

The first dielectric layer 104 may be formed of a low-K dielectric material such as fluorosilicate glass (FSG) and/or the like. The first dielectric layer 104 may function as an inter-metal dielectric layer. The first dielectric layer 104 may be formed by suitable deposition techniques such as PECVD techniques, high-density plasma chemical vapor deposition (HDPCVD) and/or the like.

The first metal line 112 and the second metal line 114 may be made through any suitable formation process (e.g., lithography with etching, damascene, dual damascene, or the like) and may be formed using suitable conductive materials such as copper, aluminum, aluminum alloys, copper alloys, any combinations thereof and/or the like.

In accordance with some embodiments, the first metal line 112 and the second metal line 114 may be formed through a damascene process, whereby masks are deposited onto the surface of the first dielectric layer 104, openings are etched into the surface, and conductive material (such as tungsten or copper) is used to fill the openings.

It should be noted that the first metal line 112 and the second metal line 114 may comprise one or more layers of conductive material. For example, the first metal line 112 and the second metal line 114 may include barrier layers, adhesive layers, multiple conductive layers, or the like.

The first dielectric layer 104 and the metal lines embedded in the first dielectric layer 104 may be collectively called a first metallization layer. While FIG. 3 shows the first metallization layer formed over the substrate 102, one skilled in the art will recognize that more inter-metal dielectric layers (not shown) and the associated metal lines and plugs (not shown respectively) may be formed between the first metallization layer and the substrate 102 shown in FIG. 3. In particular, the layers between the metallization layer and the substrate shown in FIG. 3 may be formed by alternating layers of dielectric (e.g., extremely low-k dielectric material) and conductive materials (e.g., copper).

Figure 4:
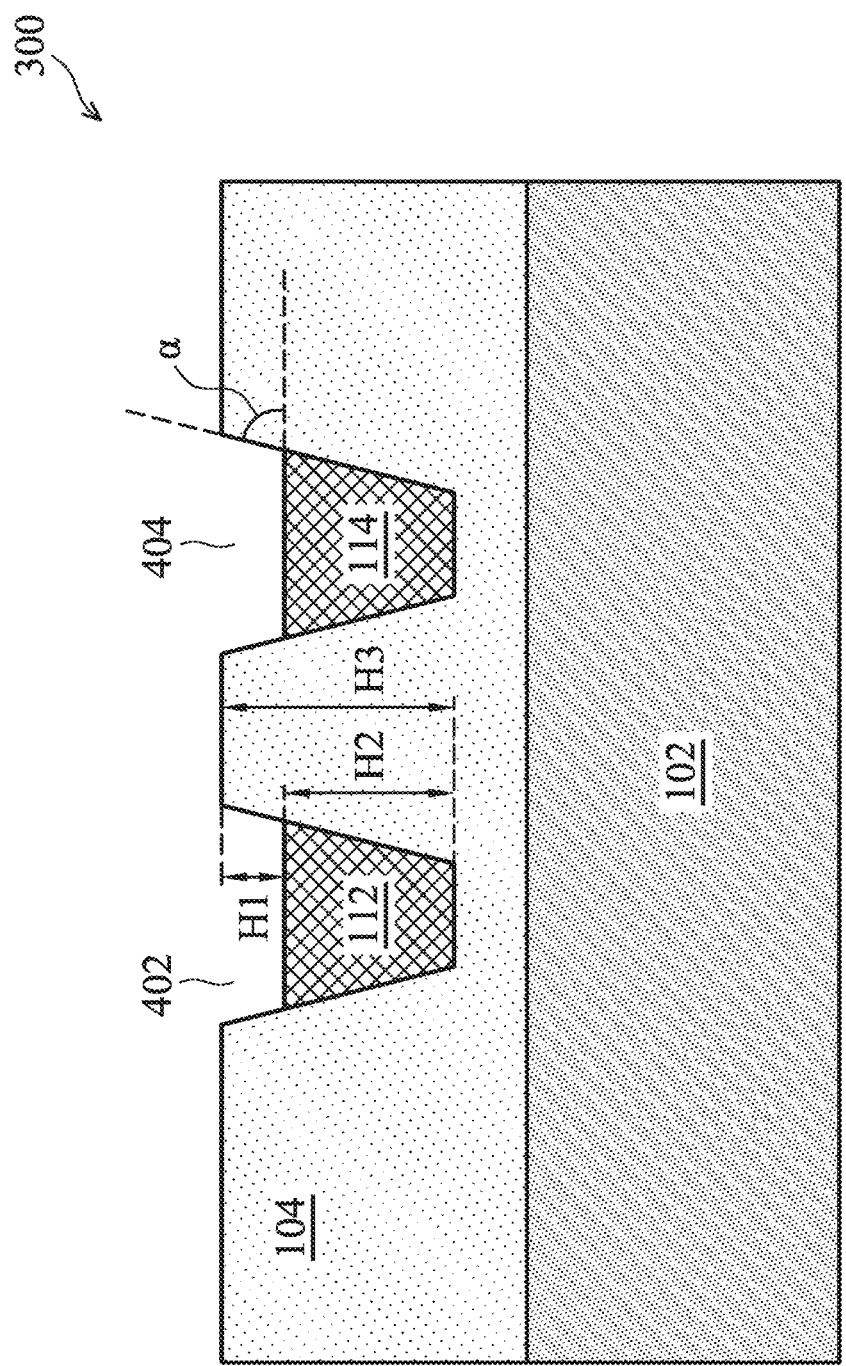
FIG. 4 illustrates a cross sectional view of the semiconductor device shown in FIG. 3 after a first etching process is applied to the metal lines in accordance with various embodiments of the present disclosure.

FIG. 4 illustrates a cross sectional view of the semiconductor device shown in FIG. 3 after a first etching process is applied to the metal lines in accordance with various embodiments of the present disclosure. A suitable etching process such as wet-etching or dry-etching may be applied to the first metal line 112 and the second metal line 114. The detailed operations of either the dry etching process or the wet etching process are well known, and hence are not discussed herein to avoid repetition. In accordance with an embodiment, after an etching process is employed to remove an upper portion of the metal lines, two inverted trapezoidal trenches 402 and 404 are formed as shown in FIG. 4.

In some embodiments, the depth of the inverted trapezoidal trenches 402 and 404 is defined as H1 as shown in FIG. 4. The height of the remaining portion of the metal lines 112 and 114 is defined as H2. The original thickness of the metal lines 112 and 114 prior to the etching process is defined as H3. In according to some embodiments, H1 may be approximately equal to 10 nm. H2 may be approximately equal to 45 nm. H3 may be approximately equal to 55 nm.

In some embodiments, the ratio of H1 to H2 is in a range from about 0.2 to about 1. The ratio of H1 to H3 is in a range from about 0.167 to about 0.5. Moreover, the sidewall of the inverted trapezoidal trenches (e.g., the inverted trapezoidal trench 404) and the horizontal axis form an angle α as shown in FIG. 4. In some embodiments, α is approximately equal to 87 degrees.

Figure 5:
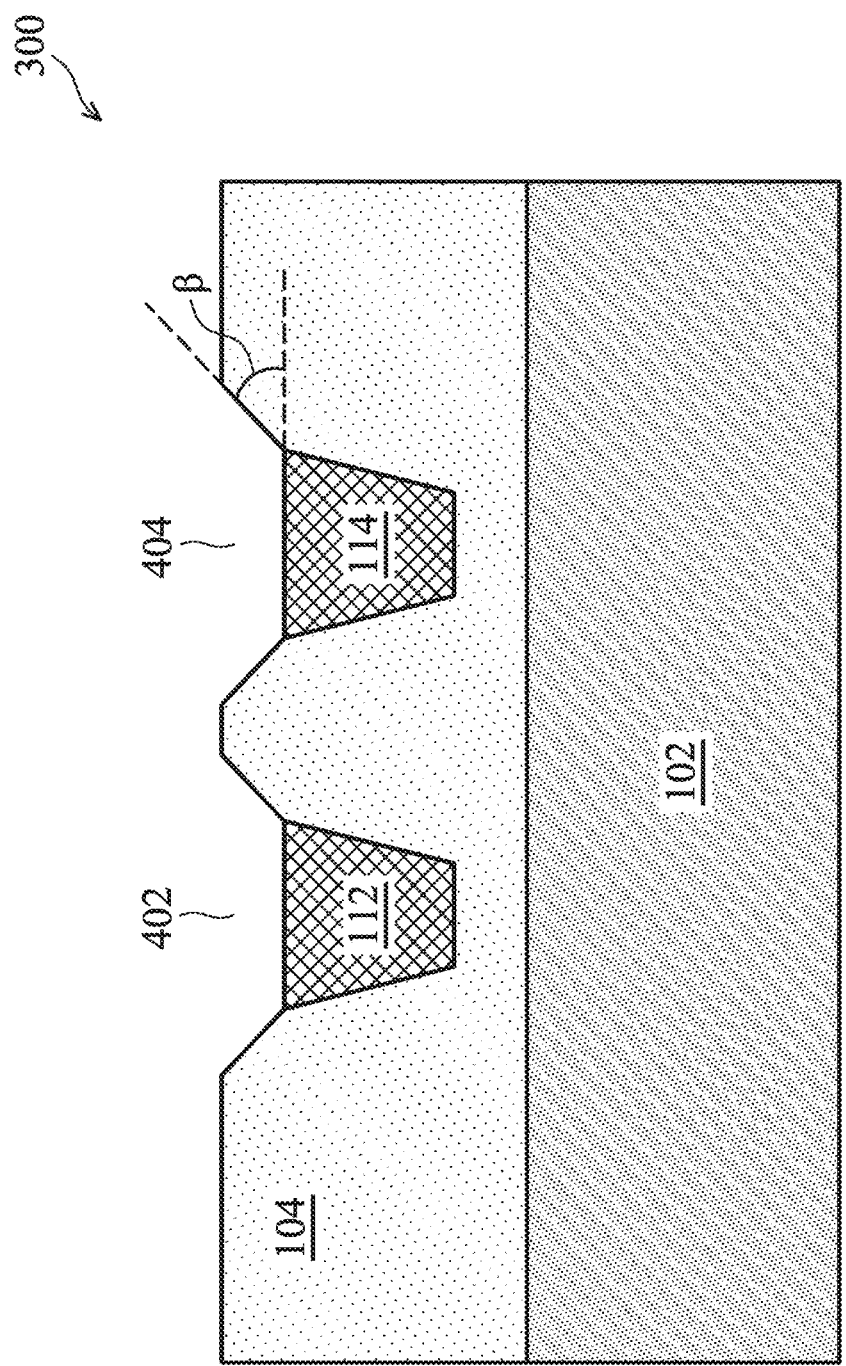
FIG. 5 illustrates a cross sectional view of the semiconductor device shown in FIG. 4 after a second etching process is applied to the sidewalls of the inverted trapezoidal trenches in accordance with various embodiments of the present disclosure.

FIG. 5 illustrates a cross sectional view of the semiconductor device shown in FIG. 4 after a second etching process is applied to the sidewalls of the inverted trapezoidal trenches in accordance with various embodiments of the present disclosure. In some embodiments, the second etching process may be a dry-etching process. The detailed operations of the dry etching process are well known, and hence are not discussed herein to avoid repetition. In accordance with some embodiments, the second etching process is employed to trim the sidewalls of the inverted trapezoidal trenches 402 and 404 so as to define the corner facets of the trenches.

After the second etching process is applied to the sidewalls of the inverted trapezoidal trenches 402 and 404, portions of the sidewalls are removed as a result. In some embodiments, as shown in FIG. 5, the sidewall of the inverted trapezoidal trench 404 and the horizontal axis form an angle β as shown in FIG. 5. In some embodiments, the angle β is greater than or equal to 45 degrees.

Figure 6:
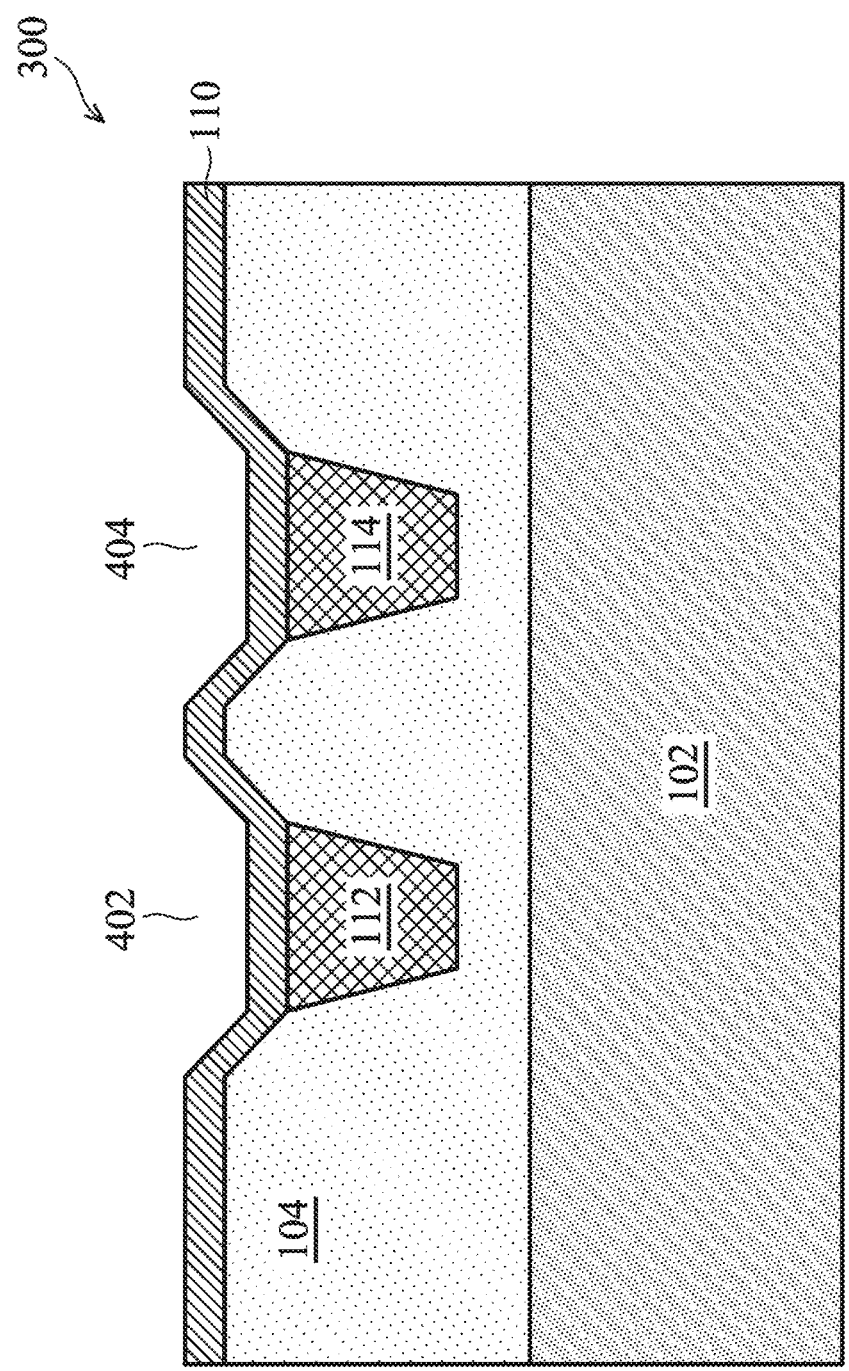
FIG. 6 illustrates a cross sectional view of the semiconductor device shown in FIG. 5 after a dielectric layer is formed on the sidewalls and the bottoms of the trenches in accordance with various embodiments of the present disclosure.

FIG. 6 illustrates a cross sectional view of the semiconductor device shown in FIG. 5 after a dielectric layer is formed on the sidewalls and the bottoms of the trenches in accordance with various embodiments of the present disclosure. The second dielectric layer 110 is deposited over the first dielectric layer 110 as well as the inverted trapezoidal trenches 402 and 404. As shown in FIG. 6, the second dielectric layer 110 is conformal to the inverted trapezoidal trenches 402 and 404.

In some embodiments, the second dielectric layer 110 is a liner layer. The liner layer may be a high etch selectivity layer. In addition, the liner layer may function as an etch stop layer. Throughout the description, the second dielectric layer 110 is alternatively referred to as the liner layer 110. The liner layer 110 may be formed of any suitable dielectric materials such as TEOS, silicon nitride, oxide, silicon oxynitride, low-K dielectric materials, high-K dielectric materials and/or the like.

The liner layer 110 may be formed using suitable fabrication processes such as a PECVD process, although other suitable processes, such as PVD, atomic layer deposition (ALD) and/or the like, may alternatively be used. Additionally, the liner layer 110 may be formed to a thickness in a range from about 10 Angstroms to about 50 Angstroms.

Figure 7:
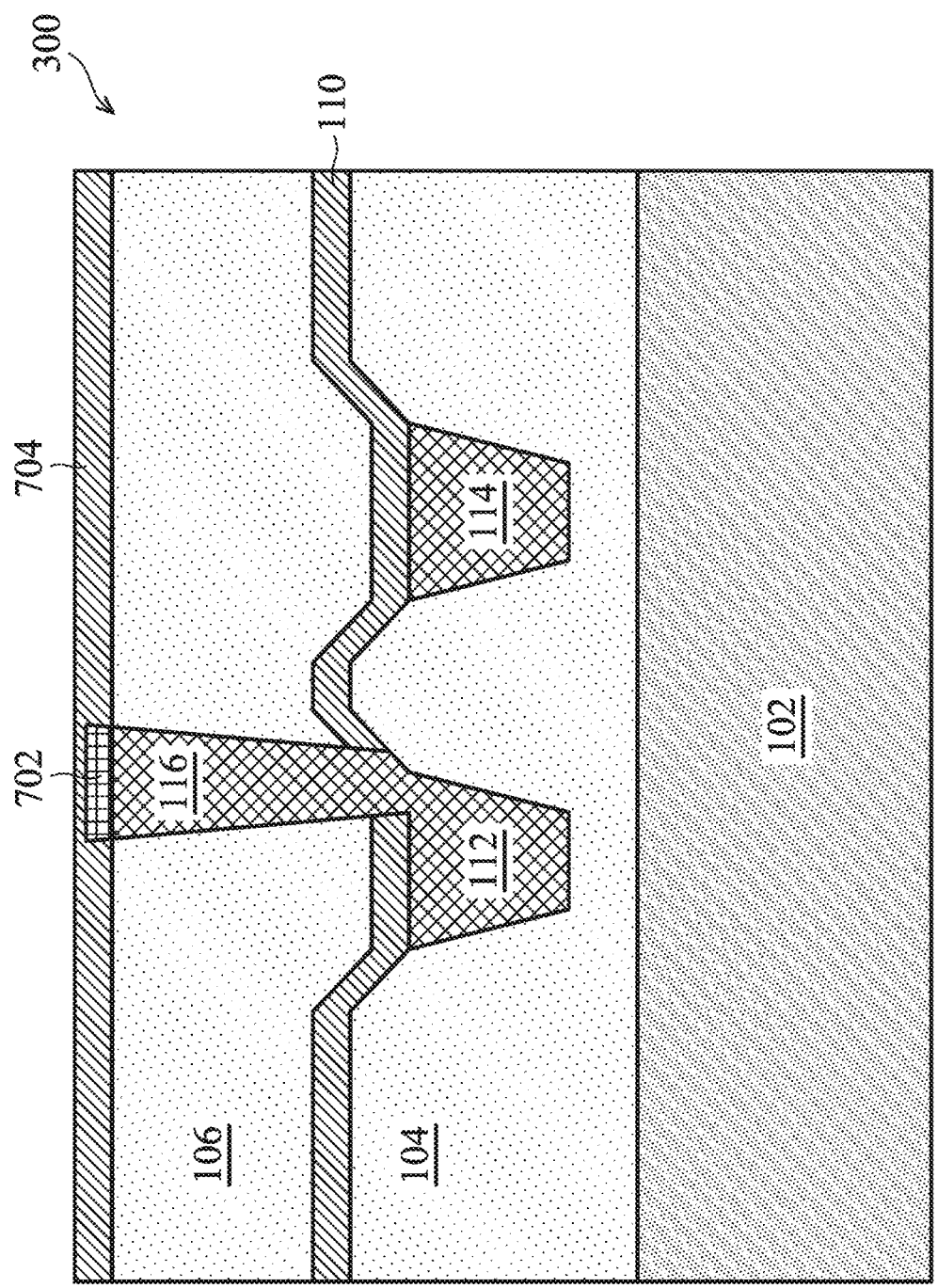
FIG. 7 illustrates a cross sectional view of the semiconductor device after a dielectric layer is formed over the liner layer and a via is formed in the dielectric layer in accordance with various embodiments of the present disclosure.

FIG. 7 illustrates a cross sectional view of the semiconductor device after a dielectric layer is formed over the liner layer and a via is formed in the dielectric layer in accordance with various embodiments of the present disclosure. The third dielectric layer 106 may be similar to the first dielectric layer 104, and hence is not discussed in further detail herein to avoid repetition.

In accordance with some embodiments, the third dielectric layer 106 may be patterned using, e.g., a photolithographic masking and etching process, whereby a photolithographic mask (not shown in FIG. 7) is formed over the third dielectric layer 106 and then exposed to a patterned light.

After exposure, desired portions of the photolithographic mask are removed to expose the underlying dielectric layer 106, which may then be etched to remove the exposed portions, thereby patterning the third dielectric layer 106 to form an opening (not shown). It should be noted that the opening may be formed by any other suitable semiconductor patterning techniques such as an etching process, a laser ablation process, any combinations thereof and/or the like.

A barrier layer (not shown) may be deposited on the surface of the opening. The barrier layer may be formed of titanium, titanium nitride, tantalum, tantalum nitride, and combinations thereof and/or the like. The barrier layer may be formed using suitable fabrication techniques such as ALD, PECVD, plasma enhanced physical vapor deposition (PEPVD) and/or the like.

A seed layer (not shown) may be formed over the barrier layer. The seed layer may be may be formed of copper, nickel, gold, any combination thereof and/or the like. The seed layer may be formed by any suitable deposition techniques such as PVD, CVD and/or the like. The seed layer may have a thickness in a range from about 50 Angstroms to about 1,000 Angstroms.

In addition, the seed layer may be alloyed with a material that improves the adhesive properties of the seed layer so that it can act as an adhesion layer. For example, the seed layer may be alloyed with a material such as manganese or aluminum, which will migrate to the interface between the seed layer and the barrier layer and will enhance the adhesion between these two layers. The alloying material may be introduced during formation of the seed layer. The alloying material may comprise no more than about 10% of the seed layer.

A conductive material may be filled in the opening to form a via 116 coupled to the first metal line 112. In particular, the bottom of the via 116 is in direct contact with the top surface of the first metal line 112.

During the fabrication process of the via 116, an overlay alignment shift defect may occur and cause a shift of the via 116 from the centerline of the first metal line 112 to the edge of the first metal line 112 as shown in FIG. 7. Although the via 116 is shifted to one side of the first metal line 112, the bottom of the via 116 is conformal to the sidewall of the inverted trapezoidal trench as shown in FIG. 7.

Such a via shown in FIG. 7 may be alternatively referred to as a self-aligned via because, after a less precise alignment such as an alignment shift, the bottom of the via is aligned with the sidewall of the inverted trapezoidal trench. Such an alignment helps to improve the spacing between the via and the adjacent mental lines (e.g., the via 116 and the second metal line 114). The detailed description of the improvement will be illustrated below with respect to FIG. 8.

The conductive material filled in the opening may be copper, but can be any suitable conductive materials, such as copper alloys, aluminum, tungsten, silver, any combinations thereof and/or the like. The conductive material may be formed by suitable techniques such as an electro-less plating process, CVD, electroplating and/or the like.

A planarization process is performed to remove excess conductive materials in accordance with various embodiments. The planarization process may be implemented by using suitable techniques such as grinding, polishing and/or chemical etching, a combination of etching and grinding techniques.

In accordance with some embodiments, the planarization process may be implemented by using a chemical mechanical polishing (CMP) process. In the CMP process, a combination of suitable etching materials and abrading materials are put into contact with the top surface of the semiconductor device and a grinding pad (not shown) is used to grind away excess copper.

Figure 8:
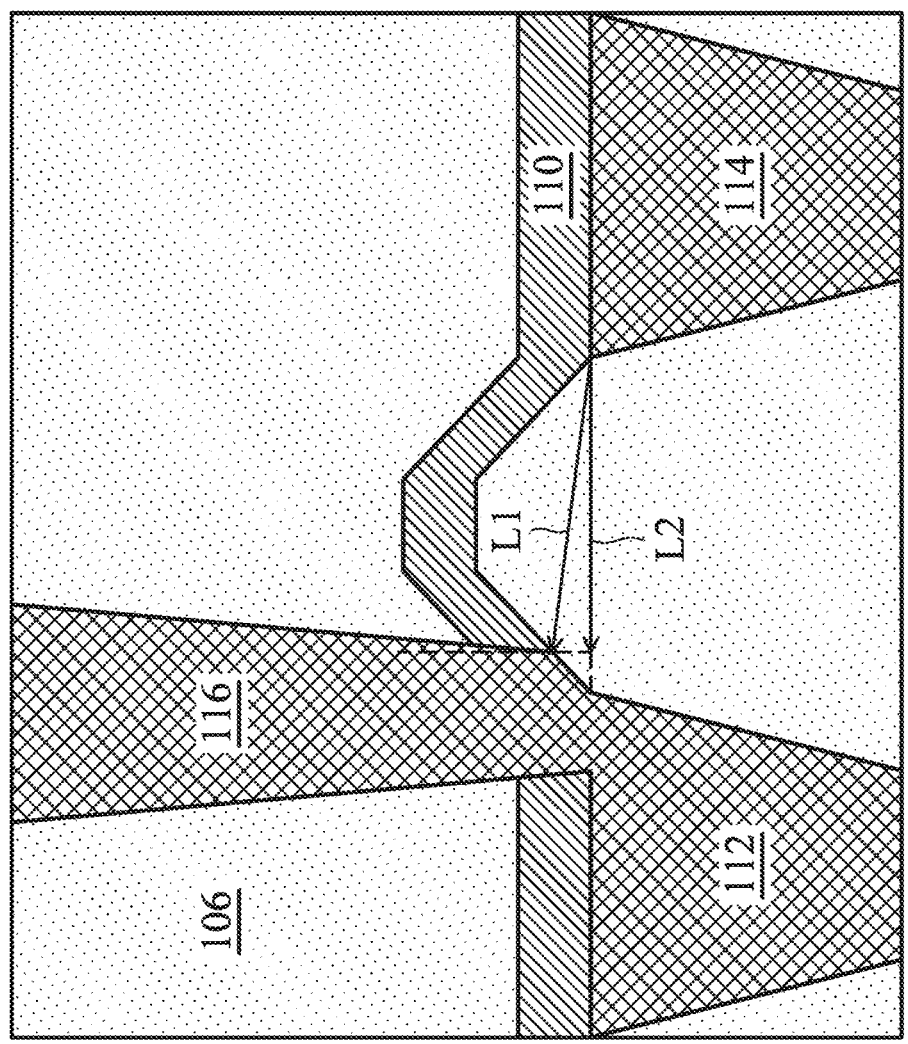
FIG. 8 illustrates a zoomed-in cross-sectional view of the semiconductor device shown in FIG. 7 in accordance with various embodiments of the present disclosure.

FIG. 8 illustrates a zoomed-in cross-sectional view of the semiconductor device shown in FIG. 7 in accordance with various embodiments of the present disclosure. As described above with respect to FIG. 7, some level of misalignment may occur due to a variety of overlay alignment shift defects. The misalignment may reduce the spacing between the via 116 and the second metal line 114. However, the inverted trapezoidal trenches may help to increase the spacing between the via 116 and the second metal line 114.

As shown in FIG. 8, the actual spacing between the via 116 and the second metal line 114 is defined as L1. On the other hand, without having an inverted trapezoidal trench over the first metal line 112, the spacing between the via 116 and the second metal line 114 is defined as L2 as shown in FIG. 8.

FIG. 8 shows L1 and L2 are sides of a right triangle. In particular, L1 is a side opposite the right angle of a right triangle. L2 is a leg of the right triangle. As such, the value of L1 is greater than the value of L2. Therefore, the spacing may be improved after an inverted trapezoidal trench (e.g., the trench over the first metal line 112) is employed as shown in FIG. 8.

In accordance with an embodiment, an apparatus a first dielectric layer formed over a substrate, a first conductive structure embedded in the first dielectric layer, wherein a top surface of the first conductive structure and a surface of the first dielectric layer form a first inverted trapezoidal shape, a second conductive structure embedded in the first dielectric layer, wherein a top surface of the second conductive structure and the surface of the first dielectric layer form a second inverted trapezoidal shape, a second dielectric layer formed over the first dielectric layer and a third conductive structure embedded in the second dielectric layer, wherein a bottom of the third conductive structure is in direct contact with the top surface of the first conductive structure and the bottom of the third conductive structure is conformal to the first inverted trapezoidal shape.

In accordance with an embodiment, a device comprises a first metal line and a second metal line embedded in a first dielectric layer over a substrate, wherein a top surface of the first dielectric layer is higher than top surfaces of the first metal line and the second metal line, a liner layer over the first dielectric layer, a second dielectric layer over the liner layer and a conductive via extending through the second dielectric layer and the liner line, wherein a bottom of a first portion of the conductive via is in contact with the top surface of the first metal line and a bottom of a second portion of the conductive via is in contact with a sidewall of the first dielectric layer.

In accordance with an embodiment, an apparatus comprises a first metal feature in a first dielectric layer over a substrate, wherein a sidewall portion of the first dielectric layer is over a top surface of the first metal feature, a second dielectric layer over the first dielectric layer and a second metal feature extending through the second dielectric layer, wherein a bottom of a first portion of the second metal feature is in contact with the top surface of the first metal feature and a bottom of a second portion of the second metal feature is in contact with the sidewall portion of the first dielectric layer.

In accordance with an embodiment, a device includes a first conductive structure within a first dielectric layer, a second dielectric layer over the first dielectric layer, and a second conductive structure within the second dielectric layer. A sidewall of the first dielectric layer extends from a sidewall of the first conductive structure to a topmost surface of the first dielectric layer. A topmost surface of the first conductive structure is below the topmost surface of the first dielectric layer. A slope of the sidewall of the first conductive structure is different from a slope of the sidewall of the first dielectric layer. A bottommost surface of the second dielectric layer is below the topmost surface of the first dielectric layer. The second conductive structure is in physical contact with the topmost surface of the first conductive structure and the sidewall of the first dielectric layer. A first portion of the sidewall of the first dielectric layer not covered by the second conductive structure is covered by the second dielectric layer.

In accordance with an embodiment, a device includes a first conductive structure and a second conductive structure embedded in a first dielectric layer, a second dielectric layer over the first dielectric layer, and a third conductive structure embedded in the second dielectric layer. A topmost surface of the first conductive structure and a topmost surface of the second conductive structure are below a topmost surface of the first dielectric layer. A first portion of the first dielectric layer interposed between the first conductive structure and the second conductive structure has a trapezoidal shape. A bottommost surface of the second dielectric layer is below the topmost surface of the first dielectric layer. The third conductive structure is in physical contact with the topmost surface of the first conductive structure and the first portion of the first dielectric layer. A surface of the first portion of the first dielectric layer not covered by the third conductive structure is covered by a dielectric material.

In accordance with an embodiment, a method includes depositing a first dielectric layer over a substrate. A first conductive structure is formed in the first dielectric layer. The first conductive structure is recessed below a topmost surface of first dielectric layer to form a first trench in the first dielectric layer. The first trench is reshaped to form a reshaped first trench. The reshaped first trench is wider than the first trench. An etch stop layer is deposited along a sidewall and a bottom of the reshaped first trench. A second dielectric layer is deposited over the etch stop layer. A second conductive structure is formed in the second dielectric layer. The second conductive structure extends through the etch stop layer and is in physical contact with a topmost surface of the first conductive structure and the sidewall of the reshaped first trench.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a first dielectric layer formed over a substrate, the first dielectric layer being a single dielectric layer;
   a first conductive structure in the first dielectric layer, wherein a top surface of the first conductive structure is recessed below an upper surface of the first dielectric layer, wherein a first sidewall of the first dielectric layer at an interface between the first dielectric layer and the first conductive structure has a first slope, wherein a second sidewall of the first dielectric layer extends from the first sidewall to the upper surface of the first dielectric layer at a second slope different from the first slope;
   a second dielectric layer over the first dielectric layer and the first conductive structure, the second dielectric layer extending below the upper surface of the first dielectric layer to the first conductive structure, the second dielectric layer extending along the second sidewall of the first dielectric layer; and
   a second conductive structure extending through the second dielectric layer to electrically connect to the first conductive structure, wherein the second conductive structure contacts the second sidewall of the first dielectric layer.

2. The apparatus of claim 1, wherein a recess above the first conductive structure has a first inverted trapezoidal shape.

3. The apparatus of claim 1, further comprising:
   a third conductive structure, wherein the third conductive structure is recessed below the upper surface of the first dielectric layer, wherein the second dielectric layer completely covers an upper surface of the third conductive structure in a cross-sectional view.

4. The apparatus of claim 3, wherein the upper surface of the third conductive structure and sidewalls of the first dielectric layer form a second inverted trapezoidal shape.

5. The apparatus of claim 1, wherein the second dielectric layer has a non-planar upper surface.

6. The apparatus of claim 5, further comprising:
   a third dielectric layer over the second dielectric layer, wherein the second conductive structure extends through the third dielectric layer, wherein an upper surface of the third dielectric layer is flat.

7. The apparatus of claim 6, wherein the second dielectric layer has a thickness in a range from 10 Angstroms to 50 Angstroms.

8. A device comprising:
   a first dielectric layer;

a first conductive structure and a second conductive structure embedded in the first dielectric layer, the first dielectric layer comprising a first dielectric material having a first composition extending from an upper surface of the first dielectric layer to below an upper surface of the first conductive structure and an upper surface of the second conductive structure, wherein the upper surface of the first conductive structure and the upper surface of the second conductive structure are recessed below the upper surface of the first dielectric layer, wherein a first sidewall of the first dielectric layer has a first slope and a second slope, wherein the first sidewall having the first slope is adjacent the first conductive structure, wherein the first sidewall having the second slope extends from the first sidewall having the first slope to the upper surface of the first dielectric layer, wherein the first slope is greater than the second slope, wherein the upper surface of the first conductive structure and sidewalls of the first dielectric layer form a trapezoidal shape;

a second dielectric layer over the first dielectric layer, wherein a bottommost surface of the second dielectric layer is below the upper surface of the first dielectric layer, wherein a bottommost surface of the second dielectric layer contacts the first conductive structure in a cross-sectional view, wherein the second dielectric layer completely covers the upper surface of the second conductive structure in the cross-sectional view; and a third conductive structure in the second dielectric layer, wherein the third conductive structure is in physical contact with the upper surface of the first conductive structure and only a portion of the first sidewall having the second slope of the first dielectric layer.

9. The device of claim 8, wherein a first portion of the first dielectric layer interposed between the first conductive structure and the second conductive structure has a trapezoidal shape.

10. The device of claim 8, further comprising:
a third dielectric layer over the second dielectric layer, wherein an upper surface of the third dielectric layer is flatter than an upper surface of the second dielectric layer.

11. The device of claim 10, wherein the second slope relative to a horizontal line parallel to the upper surface of the first dielectric layer is greater than or equal to 45 degrees.

12. The device of claim 8, wherein the first conductive structure is a gate electrode.

13. The device of claim 8, wherein a ratio of a first distance to a thickness of the first conductive structure is in a range from about 0.2 to about 1, wherein the first distance is a depth of a recess from the upper surface of the first dielectric layer to the upper surface of the first conductive structure.

14. The device of claim 8, wherein a thickness of the second dielectric layer is in a range from 10 Angstroms to 50 Angstroms, wherein a depth of a recess from the upper surface of the first dielectric layer to the upper surface of the first conductive structure is about 10 nm.

15. A device comprising:
a first dielectric layer over a substrate;
a first conductive structure in the first dielectric layer, a first sloped sidewall of the first dielectric layer and an upper surface of the first conductive structure forming a trench, wherein the trench comprises the first sloped sidewall of the first dielectric layer extending from the first conductive structure to an upper planar surface of the first dielectric layer;
an etch stop layer along the first sloped sidewall and a bottom of the trench;
a second dielectric layer over the etch stop layer; and
a second conductive structure in the second dielectric layer, wherein the second conductive structure extends through the etch stop layer and is in physical contact with a topmost surface of the first conductive structure and the first sloped sidewall of the first dielectric layer in a cross-sectional view, wherein the upper planar surface of the first dielectric layer is free of the second conductive structure, wherein the second conductive structure overlaps an interface between the first conductive structure and the first dielectric layer.

16. The device of claim 15, wherein the first sloped sidewall of the first dielectric layer has a different slope than a sidewall of the first dielectric layer contacting the first conductive structure.

17. The device of claim 15, wherein the first sloped sidewall forms an angle with a horizontal line, the angle being greater than or equal to 45 degrees.

18. The device of claim 15, wherein a ratio of a depth of the trench to a height of the first conductive structure is in a range from about 0.167 to about 0.5.

19. The device of claim 15, wherein a thickness of the etch stop layer is in a range of 10 Angstroms to about 50 Angstroms, wherein a depth of the trench is about 10 nm.

20. The device of claim 15, wherein the first dielectric layer does not extend over the first conductive structure in the cross-sectional view.

* * * * *